United States Patent

[11] 3,605,062

[72] Inventors William G. Tinkelenberg;
Dennis E. Rich, both of Phoenix, Ariz.

[21] Appl. No. 838,286
[22] Filed July 1, 1969
[45] Patented Sept. 14, 1971
[73] Assignee Honeywell Information Systems Inc. Phoenix, Ariz.

[54] CONNECTOR AND HANDLING DEVICE FOR MULTILEAD ELECTRONIC ELEMENTS
2 Claims, 5 Drawing Figs.

[52] U.S. Cl. .......... 339/17 CF, 206/1 R, 317/101 CC, 339/174
[51] Int. Cl. .......... H01r 13/50, H02b 1/06
[50] Field of Search .......... 339/17 C, 17 CF, 59, 61, 95, 174, 176 M, 176 MF, 176 MP, 191 M, 192, 220, 221; 317/101 A, 101 C, 101 CC; 174/138.5

[56] References Cited

UNITED STATES PATENTS

| | | | |
|---|---|---|---|
| 3,289,045 | 11/1966 | Pritikin et al. .......... | 317/101 |
| 3,345,541 | 10/1967 | Cobaugh et al. .......... | 317/101 |

OTHER REFERENCES

Morgan, R. T., Joining Dip Modules To P/C Cards, IBM Tech. Disclosure Bulletin, Vol. 11 No. 7, December 1968, P. 736 Copy in 339-17 CF

*Primary Examiner*—Marvin A. Champion
*Assistant Examiner*—Lawrence J. Staab
*Attorneys*—Edward W. Hughes, Frank L. Neuhauser, Oscar B. Waddell, Joseph B. Forman and James A. Pershon

ABSTRACT: A device adapted to facilitate the handling, storage, and shipping of a multilead electronic element. The device also provides a solderless demountable connector for attaching the element to a wiring panel.

INVENTORS.
WILLIAM G. TINKELENBERG
DENNIS E. RICH
BY
Herbert E. Haynes Jr
AGENT

CONNECTOR AND HANDLING DEVICE FOR MULTILEAD ELECTRONIC ELEMENTS

BACKGROUND OF THE INVENTION

This invention pertains to connectors, and more particularly to a connector and handling device for a multilead electronic element.

1. Field of the Invention

One of the primary objectives in the design of modern electronic equipment is to increase their electronic operating speed, and since electronic signals travel approximately 13 inches per nanosecond, the trend is to shorten the distances that the signals must travel.

To accomplish the desired reduction of signal travel time, miniaturized components capable of being packaged in dense arrays have been developed. The miniaturized components and dense packaging have resulted in problems of handling and mounting which is especially troublesome in the case of multilead integrated circuit packages.

Miniature integrated circuits are packaged in extremely small and difficult to handle structures. The plurality of conductive buses or leads which extend therefrom are relatively thin, flexible, and easily damaged. These leads cannot withstand rough handling as for example, during storage, shipping and/or circuit fabrication and assembly.

It has long been known that soldering is a good type of electrical connection because it is gastight. The desirable feature of a gastight connection is that no air or moisture can enter the pores and irregularities in the metal to cause corrosion which would decrease signal strength due to the increased impedance of the connection.

The dense packaging arrays desirable in modern electronic equipment have increased the cost of individual wiring boards to the point that stockpiling a spare of each type of board at equipment installations is very expensive. The current trend therefore is to repair the boards at the installation whenever possible. In the process of trouble shooting a wiring board, it is often necessary to resort to the substitution method; that is, removal and replacement of one or more elements until the trouble has been corrected. The soldered connections of elements in densely packaged arrays has made the removal and replacement of elements hazardous as many costly elements and wiring boards have been destroyed by the application of excessive heat.

2. Prior Art

In an attempt to circumvent the problems associated with the solder mounting of integrated circuits on wiring boards, a prior art solderless connector was developed. This prior art connector is shown in U.S. Pat. No. 3,341,806, and comprises a plurality of cavities in an insulative housing with each cavity containing a metallic spring element. Each of the cavities is positioned within the housing to receive one lead of the integrated circuit and one aligned pin of the wiring board. During insertion of the leads and pins into this prior art connector, the spring elements force the leads and pins into frictional contact with each other to apply a wiping action therebetween which smooths and cleans the metal surfaces. The spring elements are then employed to maintain a force on the juxtaposed surfaces to provide a gastight connection between the leads and pins. Besides being relatively expensive to manufacture, the force of the spring element is applied to a very small area of the lead so that the area of gastight connection between the pins and the leads is also relatively small, certainly not significantly larger than the area contacted by the spring element. The small area of gastight connection between the leads and the pins provides little, if any, margin for error, that is, by way of example, any corrosion residue, dirt, metal irregularities or flaws in the metal, and the like which may be present in the small contact area could expose the connection to corrosion. This prior art connector is used only as a connector and makes no provisions for handling, storage and shipment of the integrated circuit element.

SUMMARY OF THE INVENTION

In accordance with the present invention, a new and improved handling device and demountable solderless connector is provided which facilitates the handling, storage, shipping, mounting and removal of integrated circuits called more particularly the dual in-line package, hereinafter called "DIP." The connector comprises an insulative housing having a plurality of apertures formed therein; each aperture is located to receive a lead of the DIP. The integrated circuit package is positioned (preferably at the time of manufacture) on top of the connector with the leads extending through the apertures. The portions of the leads that extend beyond the bottom of the apertures are bent inwardly toward the center of the housing and fit into transverse slots or channels formed therein to firmly assemble the DIP and the connector.

The wiring panel, to which the connector and DIP assembly are to be attached, is provided with a plurality of mounting pins which are arranged in a spatial relationship similar to the apertures of the connector. The connector and DIP assembly are mounted on the wiring panel by positioning the assembly over the pins and pushing it toward the panel so that each pin enters an aligned aperture. Each aperture is designed so that with the DIP lead positioned therein, insertion of the pin creates an interference fit which provides a wiping action along the juxtaposed surfaces of the lead and pin. The wiping action cleans and reduces metal irregularities so that a gastight connection is produced over a substantial length of the lead and pin, the length of this area of gastight connection is approximately equal to the depth of the aperture.

To maintain the large area of gastight connection produced by the wiping action, it is necessary to apply a force to the leads and pins to firmly hold their wiped juxtaposed surfaces together. This holding force is provided by the resilience of the material from which the connector is fabricated. A certain amount of connector deflection or distortion is caused by the interference fit between the leads and pins, the resiliency of the connector material; that is, its attempting to return to its undeflected state, not only provides the necessary holding force but also firmly mounts the connector and DIP assembly to the wiring panel.

Accordingly, it is an object of the present invention to provide a connector and handling device which is simple and inexpensive to manufacture.

Another object of the present invention is to provide an improved solderless demountable connector and handling device.

A further object of the present invention is to provide a connector and handling device, which during insertion of the pins applies a wiping action between the juxtaposed surfaces of the leads and pins to produce a large area of gastight connection therebetween.

A still further object of this invention is to provide a connector and handling device which applies a force to the leads and pins inserted therein to firmly hold the wiped juxtaposed surfaces together.

A still further object of the present invention is to provide a connector and handling device which protects the integrated circuit during handling, storage, shipping, and/or assembly.

The foregoing and other objects of this invention, the various features thereof as well as the invention itself, may be more fully understood from the following description when read in connection with the accompanying drawings.

PREFERRED EMBODIMENT

Figure 1:
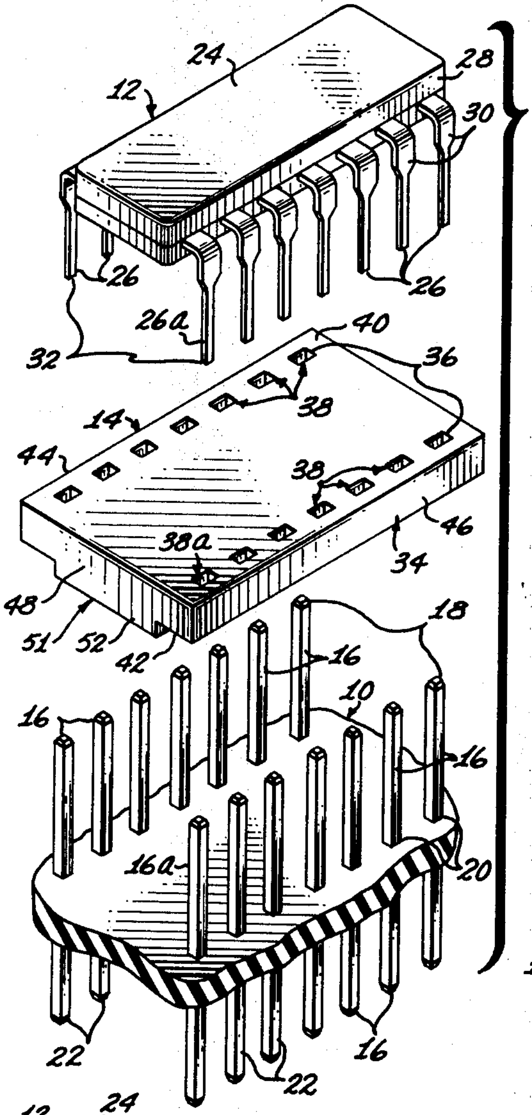
FIG. 1 is an isometric view of a fragmentary portion of a wiring panel having the connector and integrated circuit exploded therefrom.

Referring more particularly to the drawings, FIG. 1 shows an isometric view of a portion of a type of wiring panel 10, with a DIP integrated circuit 12, and a handling device or connector 14 exploded therefrom. The wiring panel 10 utilizes standard wire-wrap pins 16 arranged in two substantially parallel rows 18; the pins 16 are inserted in holes 20, and are soldered, crimped or otherwise secured therein. The wiring panel 10 is shown for illustrative purposes only as any type of wiring board would work equally as well. By way of example, a multilayer, laminated printed wiring board (not shown) could be utilized by installing pins in the standard plated-through holes which heretofore would have received the component leads. The pins 16 could be modified for this application as the lower portions or wire-wrap areas 22 would not be needed. The material from which the pins 16 are made may be, for example, phosphor bronze, beryllium copper, etc., the pin material should be selected not only for its electrical characteristics, but also for its resilience, as will be described in detail hereinafter.

The standard dual in-line integrated circuit 12 comprises a housing 24 which contains miniature internal circuitry. Electrical contact to the internal circuitry is made through a plurality of leads or prongs 26 extending laterally from sides 28 of the housing 24. The prongs 26 extend from the housing 24 a short distance and are formed to approximately a 90° angle to provide the prong contact areas 30. The prongs 26 having been formed as hereinbefore described will provide two substantially parallel rows 32 as best seen in FIG. 1.

The connector 14 may be formed as by casting, molding, etc. from any suitable dielectric material. The materials used in forming the connector 14, must not only be of good insulative quality, but should also resist creep, that is, the slow change of dimensions due to prolonged exposure to stress, and the material should also be resilient, that is, attempt to return to its natural state after deflection. A certain amount of connector deflection is expected during installation due to the force exerted by the interference fit designed into each aperture as will hereinafter be described in detail. Materials possessing the hereinbefore described characteristics are generally of the resilient synthetic class and cover both the thermosetting and thermoplastic types. Experiments have been conducted and excellent results have been obtained with polycarbonate, polypropylene and alloyed synthetic materials.

The connector 14 comprises a block 34 in which two substantially parallel rows 36 of receiving means or aperture means 38 are formed. Each aperture means 38 is formed to intercommunicate between top surface 40 and bottom surface 42 of block 34. The block is further formed to provide side surfaces 44–46, and end surfaces 48–50. Bottom surface 42 is provided with DIP assembly means 51 and comprises a downwardly depending land area 52 formed between the rows 36 of apertures 38 and extending between the ends 48 and 50. Land area 52 has a plurality of transverse slots or channel means 54 formed therein. One channel 54 is provided for each pair of transversely aligned apertures 38, and communicates between the lower openings 56 thereof.

The spatial relationships between the rows 36 and between the individual apertures 38 is such that, when the integrated circuit 12 is in place as shown best in FIG. 2, each prong 26 is inserted into a respectively aligned aperture 38, and the lower portions of prongs 26 extend below the connector as shown by broken lines. To firmly affix the integrated circuit 12 to the connector 14, the prongs 26 are bent inwardly into their respectively aligned transverse channels 54. The channels 54 may be formed to loosely receive prongs 26 or may be of smaller dimension than the prongs 26 to necessitate a force fit.

Figure 2:
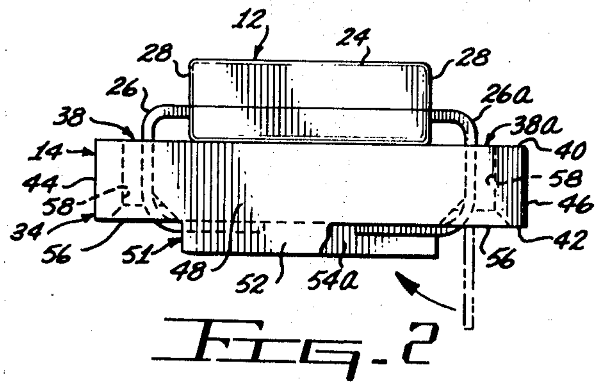
FIG. 2 is an end view of the connector partly broken away with the integrated circuit package attached.
Figure 3:
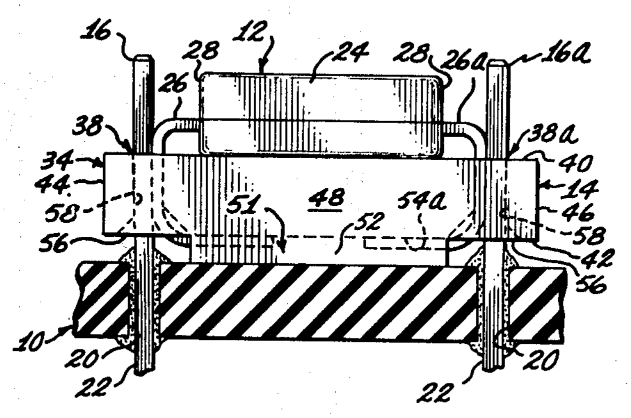
FIG. 3 is an end view of the wiring panel with the connector and integrated circuit attached.
Figure 4:
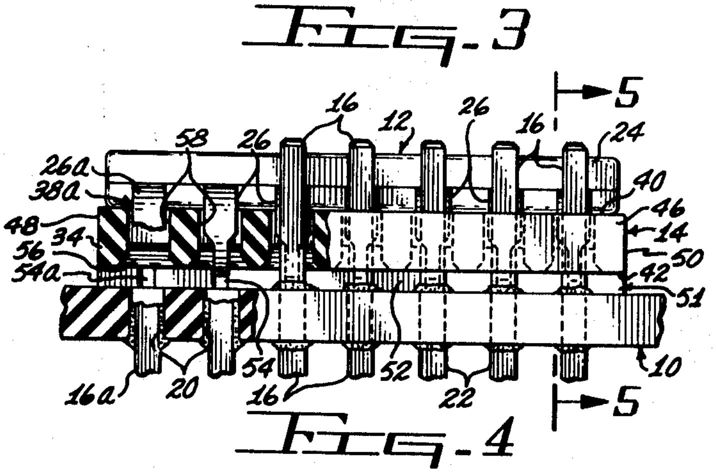
FIG. 4 is a side view partially broken away to show the wiring panel with the connector and integrated circuit attached.

By way of example, as seen in FIGS. 1 and 2, prong 26*a* is inserted into aperture 38*a* then bent into channel 54*a*, and is then ready for receiving pin 16*a*. The land area 52 having the transverse channels 54 formed therein is provided to insure insulative separation of the inwardly bent prongs 26 and also to insure that the prongs 26 do not contact the wiring panel 10.

Figure 5:
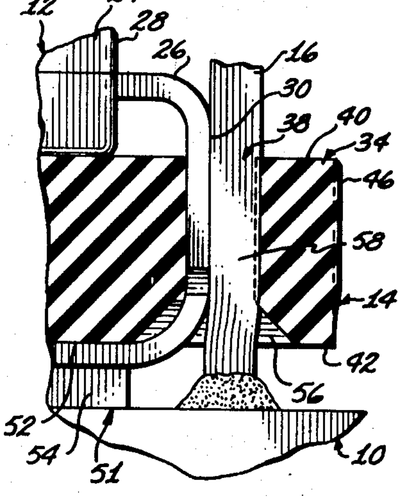
FIG. 5 is an enlarged fragmentary sectional view taken on the line 5—5 of FIG. 4.

The apertures 38 are shown as having rectangular passages 58 with beveled lower openings 56. Each of the passages 58 is formed to provide an interference fit between the prong 26 and pin 16 inserted therein. As seen in FIG. 5, inserting pin 16 into aperture 38 will deflect the pins 16 outwardly within their elastic limits, which will in turn distort the connector from its original shape shown in broken lines to its distorted configuration shown in solid lines. Inserting the pin 16 as hereinbefore described will provide a wiping action between the juxtaposed surfaces of the pin 16 and the prong 26 to clean and reduce metal irregularities so that a gastight connection is possible in an area which is substantially equal to the depth of the apertures 38. The natural resiliency of the pins 16 coupled with the deformed connector material attempting to return to its undistorted or original shape will exert a force to firmly hold the wiped juxtaposed surfaces of the pins 16 and prongs 26 together, thereby providing and maintaining a large area of gastight connection, and also firmly mounting the connector 14 and DIP 12 to the wiring panel 10.

The shape of connector 14 is shown as rectangular, and being adapted to accommodate a 14-prong DIP integrated circuit. It should be understood that the rectangular shape of the connector and the number of apertures may be altered to accommodate the number of prongs on a given integrated circuit package.

While the principles of the invention have now been made clear in a preferred embodiment, there will be immediately obvious to those skilled in the art many modifications of structure, arrangement, proportions, the elements, materials, and components used in the practice of the invention, and otherwise, which are particularly adapted for specific environments and operating requirements without departing from those principles. The appended claims are therefore intended to cover and embrace any such modifications within the limits only of the true scope of the invention.

What is claimed is:

1. In combination:

an electronic element having a plurality of prongs;

a wiring panel having a plurality of pins mounted thereon, said pins being mounted so that they are aligned with the prongs of the element; and a connector of an electrically insulating material having a top and bottom surface; a land area depending downwardly from the bottom surface of said block; a plurality of appertures in said block extending from the top surface of said block to the bottom surface of said block adjacent to the land area; said element mounted above the top surface of the connector with its prongs extending through the appertures in said block;

a plurality of transverse slots formed in the land area, the prongs of the electronic element being located in the slots in the land area of the connector, said electronic element and connector being removably mounted on said wiring panel by having the pins also occupy at least some of said appertures, each aperture in said connector adapted to receive a prong of the electronic element and a pin of the wiring panel, each of said appertures causing the prong of the electronic element to be forcibly engaged both electrically and mechanically with the corresponding pin when a pin and prong are located therein.

2. In combination:

an electronic element having a plurality of leads;

a wiring panel having substantially planar surfaces a connector, said connector comprising a block of insulative material, a plurality of lead and pin-receiving means formed in said block, each of said receiving means having a substantial length and positioned to receive one lead of the electronic element and one pin of the wiring panel;

a plurality of pins mounted on said panel, said pins being substantially normal to said planar surface of said panel and being mounted on said panel so that they juxtapositionally align with leads of the electronic element and the lead and pin-receiving means of the connector;

said connector having a top and bottom surface, a land area depending downwardly from the bottom surface of said connector; the lead and pin-receiving means in said block extending from the top surface of the block to the bottom surface of the block adjacent to the land area; a plurality of slots in said land area extending transversely thereacross;

said electronic element mounted above the top surface of the connector with each of its leads extending through a lead and pin-receiving means, each lead extending into a slot in said land area, whereby said electronic element is removably mounted on said wiring panel with its leads in electrical and physical contact with corresponding pins of said wiring panel.